(12) United States Patent
Kiyota et al.

(10) Patent No.: US 6,685,805 B2
(45) Date of Patent: Feb. 3, 2004

(54) METHOD OF MANUFACTURING SUBSTRATE HAVING TRANSPARENT CONDUCTIVE FILM, SUBSTRATE HAVING TRANSPARENT CONDUCTIVE FILM MANUFACTURED USING THE METHOD, AND TOUCH PANEL USING THE SUBSTRATE

(75) Inventors: Shogo Kiyota, Sagamihara (JP); Yukihiro Katoh, Sagamihara (JP)

(73) Assignee: Nippon Sheet Glass Co., Ltd. (JP)

( * ) Notice: Subject to any disclaimer, the term of this patent is extended or adjusted under 35 U.S.C. 154(b) by 0 days.

(21) Appl. No.: 09/909,570

(22) Filed: Jul. 20, 2001

(65) Prior Publication Data

US 2002/0034836 A1 Mar. 21, 2002

(30) Foreign Application Priority Data

Jul. 25, 2000 (JP) ........................................ 2000-223547

(51) Int. Cl.$^7$ ............................................... C23C 14/34
(52) U.S. Cl. .............................. 204/192.29; 204/192.26
(58) Field of Search ....................... 204/192.26, 192.27, 204/192.28, 192.29

(56) References Cited

U.S. PATENT DOCUMENTS 4,094,763 A * 6/1978 Gillery et al. .......... 204/192.29
4,421,622 A * 12/1983 Hollars ................... 204/192.29
5,225,273 A * 7/1993 Mikoshiba et al. .......... 428/323

FOREIGN PATENT DOCUMENTS

JP 08-043840 * 2/1996

OTHER PUBLICATIONS

Machine Translation of Kenzo et al.*
Carl et al., "Optimization of sputtered ITO films with respect to the oxygen partial pressure and substrate temperature", Thin Solid Films, 295, 1997 pp. 151–155.*
Moltzen "Characterization of transparent conductive thin films of indium oxide", J. Vac. Sci. Technol. vol. 12, No. 1, Jan./Feb. 1975 pp. 99–102.*

* cited by examiner

Primary Examiner—Rodney G. McDonald
(74) Attorney, Agent, or Firm—Rossi & Associates (57) ABSTRACT

In a method of manufacturing a substrate having a transparent conductive film in which sputtering is carried out on a transparent insulating substrate using an indium oxide/tin oxide target under an atmosphere of a mixed gas containing argon and oxygen, when the ratio of oxygen to argon in the mixed gas is in a suitable range of 0.016 to 0.018, the carrier density of the transparent conductive film becomes a maximum, while the mobility rises progressively as the ratio of oxygen to argon increases. The surface resistance of the transparent conductive film, that is the reciprocal of the product of the carrier density and the mobility, 1/(carrier density×mobility), takes a minimum value when the ratio of oxygen to argon is in the above suitable range. In this case, crystallization of the film is promoted and the percentage change between the surface resistance of the film before heat treatment and the surface resistance of the film after heat treatment can be kept down to within ±10%.

10 Claims, 5 Drawing Sheets

METHOD OF MANUFACTURING SUBSTRATE HAVING TRANSPARENT CONDUCTIVE FILM, SUBSTRATE HAVING TRANSPARENT CONDUCTIVE FILM MANUFACTURED USING THE METHOD, AND TOUCH PANEL USING THE SUBSTRATE

BACKGROUND OF THE INVENTION

1. Field of the Invention

The present invention relates to a method of manufacturing a substrate having a transparent conductive film, a substrate having a transparent conductive film manufactured using the method, and a touch panel using the substrate.

2. Prior Art

Conventionally, glass substrates having a tin-oxide-containing indium oxide (hereinafter referred to as 'ITO') film are widely used as the substrates having a transparent conductive film of liquid crystal display panels (hereinafter referred to as 'LCDs') and the like. In recent years, such glass substrates having an ITO film have also come to be used in resistive film type touch panels.

Figure 3:
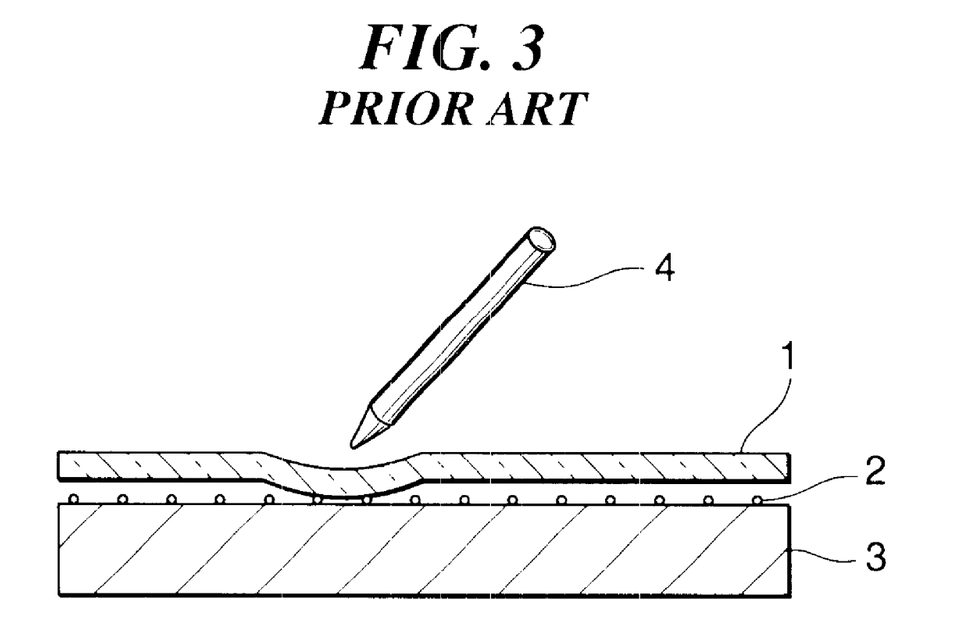
FIG. 3 is a schematic sectional view showing a resistive film type touch panel.

As shown in FIG. 3, a resistive film type touch panel is composed of a transparent upper electrode 1 and a lower electrode 3, with the lower electrode 3 and the upper electrode 1 being arranged in facing relation to one another with spacers 2 therebetween; when the upper electrode 1 is pushed with a pen 4, a finger or the like, the upper electrode 1 comes into contact with the lower electrode 3.

Figure 4A:
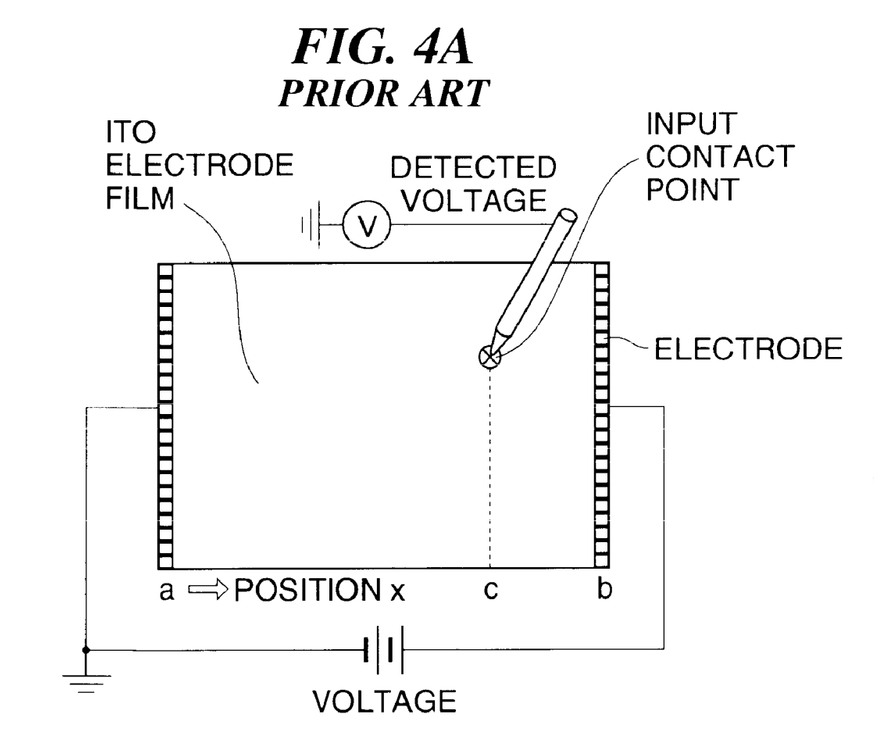
FIG. 4A is an explanatory view showing an analog method of detection of an input position in a resistive film type touch panel.
Figure 4B:
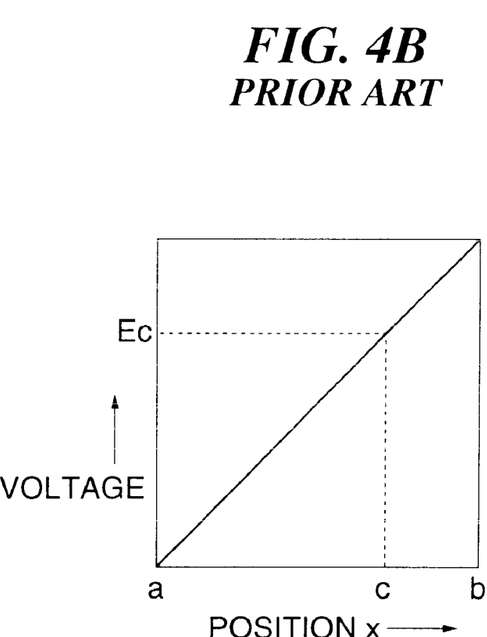
FIG. 4B is a graph showing voltage Ec against position x for the touch panel.

The method of detection of the input position in such a resistive film type touch panel may be analog or digital, with the method selectively used depending on the application. The analog detection method, which gives a higher detection resolution, is used in a wider range of applications. In the case of an analog detection type touch panel, a voltage is applied between two parallel electrodes, one at each end in a prescribed direction of the touch panel, as shown in FIG. 4A, thus forming a linear potential gradient as shown in FIG. 4B, and by measuring the voltage Ec corresponding to an input contact point, the input position c is detected.

It is required that such a resistive film type touch panel transmits light well, and so the ITO film formed on the substrate is extremely thin, usually not more than 30 nm (see for example Japanese Laid-open Patent Publication (Kokai) No. 11-167827). Moreover, in the case of an analog detection type touch panel, the ITO film on the glass substrate usually has a surface resistance of 300 to 2000Ω, and moreover since this ITO film is used as the electrode for determining the input position, there is a strict requirement for the surface resistance to be uniform.

The steps in manufacturing a resistive film type touch panel are to subject a lower electrode 3 comprised of a glass substrate having an ITO film to resist printing, etching, silver ink printing, insulating ink printing, micro dot spacer formation, scribing and so on, next bond the lower electrode 3 to an upper electrode 1 that has been prepared in a separate manufacturing step, and then seal around the upper electrode 1 and the lower electrode 3 by heat sealing. Of these steps, in a printing step such as silver ink printing or insulating ink printing and in the heat sealing step, heat treatment at a maximum temperature of 160° C. is carried out, and during this heat treatment the surface resistance of the ITO film changes; as a result, in some cases a touch panel manufactured using such a substrate will not function properly.

Specifically, when the surface resistance of the ITO film has dropped due to heat treatment, the detected voltage drops and thus a discrepancy arises between the input position and the detected position; when the surface resistance has risen, the detected voltage rises and thus the same kind of discrepancy again becomes prone to occur. Moreover, if the surface resistance distribution is not uniform, then the potential gradient loses its linearity as shown in FIG. 4B, that is, there is no longer a linear relationship between distance and potential, and hence it becomes impossible to detect the input position accurately.

Figure 5A:
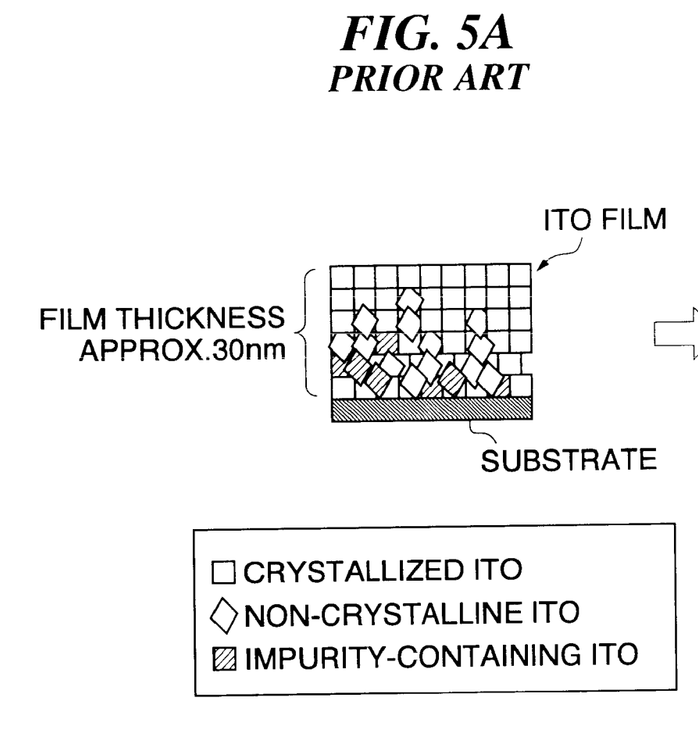
FIG. 5A shows an ITO film that has grown to a thickness of about 30 nm.
Figure 5B:
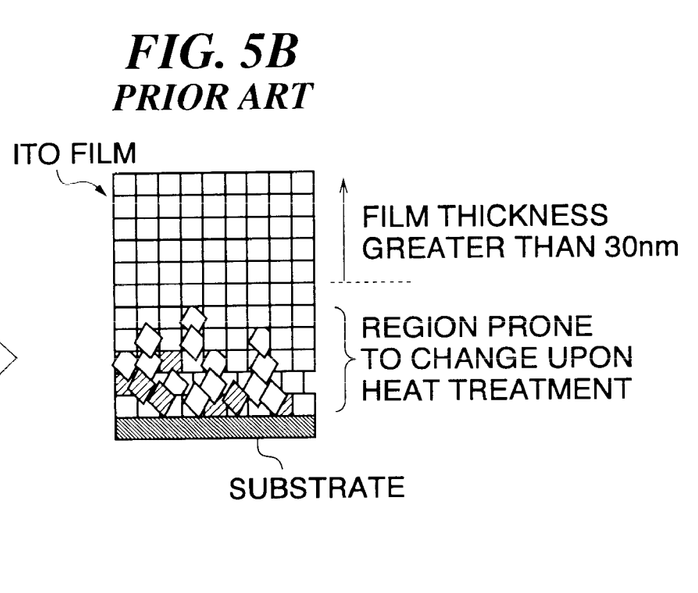
FIG. 5B shows an ITO film that has grown to a thickness greater than 30 nm.

A description will now be given, with reference to FIG. 5, of the reason why heat treatment causes the surface resistance of an ITO film to change.

The ITO film is polycrystalline, and the more film deposition is carried out at a high temperature above about 160° C., which is the crystallization temperature of ITO, the more crystallization proceeds and the more stable the crystal structure becomes. However, impurity-containing ITO and non-crystalline ITO, for which the crystal structure changes easily during subsequent heat treatment, are inevitably formed near the substrate surface during the initial stage of the film deposition (FIG. 5A), and in particular since the lattice constant of ITO is high, i.e. about 1 nm, at a film thickness of less than 30 nm the proportion of crystallized ITO is low and the proportion of impurity-containing ITO and non-crystalline ITO high (FIG. 5B). When such an ITO film containing a lot of impurity-containing ITO and non-crystalline ITO is subsequently subjected to heat treatment, the crystal structure changes due to the progression of crystallization of the film and the occurrence of oxidation, and hence the electrical properties, and thus the surface properties, of the ITO film change. This change in the surface properties becomes greater as the ITO film is made thinner and hence the proportion of the crystal structure that is unstable increases (FIG. 5A).

Considering the effects of the heat treatment that must inevitably be carried out during the manufacturing of a touch panel, it is desirable for the percentage change between the surface resistance of the ITO film before heat treatment and the surface resistance of the ITO film after heat treatment to be not more than ±10%.

The ITO film is formed on the surface of the glass substrate using an in-line type or batch type sputtering device that uses magnetron sputtering (hereinafter referred to as merely 'sputtering').

With such an existing sputtering device, it is difficult to keep the above-mentioned percentage change in the surface resistance of the ITO film down to no more than ±10% under typical conditions used conventionally when manufacturing a transparent conductive film for an LCD (for example, substrate temperature: 200 to 400° C.; sputtering pressure: 0.27 to 1.33 Pa; ratio of oxygen to argon in the mixed gas: 0 to 0.04), particularly when the thickness of the ITO film is less than 30 nm.

Methods proposed in the past for reducing the percentage change in the surface resistance have been, in the case of sputtering, to make the nitrogen doping amount in the ITO film 0.01 to 0.6 mass % and the film thickness 5 to 25 nm or to use no nitrogen doping in the ITO film and make the tin doping amount 4.2 to 8.3 at % (see Japanese Laid-open Patent Publication (Kokai) No. 2000-113732), and, in the case of applying a coating solution that forms an ITO film upon pyrolysis, to apply two such coating solutions having different pyrolysis temperatures onto the glass substrate, and then, to improve the stability of the resistance to heat treatment, carry out baking first under an oxidizing atmosphere and then under a non-oxidizing atmosphere (see Japanese Laid-open Patent Publication (Kokai) No. 2000-100263).

However, in the case of the former of the above methods, it was found in 200° C. 60-minute heat resistance tests that the percentage change in the surface resistance was kept down to within −10% to +19%, but there is a problem that this is still insufficient. Moreover, in the case of the latter of the above methods, there is a problem in that during the application of the coating solutions it is impossible to avoid foreign particles getting into the coating solutions and then during the baking there is a high probability of these foreign particles sticking, and a problem in that the percentage change in the surface resistance cannot be kept down to within ±20%, which is insufficient.

SUMMARY OF THE INVENTION

It is an object of the present invention to provide a method of manufacturing a substrate having a transparent conductive film, which is capable of suppressing change in the surface resistance of the film upon the substrate being subjected to prescribed heat treatment, a substrate having a transparent conductive film manufactured using the method, and a touch panel using the substrate.

The present inventors conducted assiduous studies to attain the above object, and as a result discovered that, in the case of a method of manufacturing a substrate having a transparent conductive film in which sputtering is carried out on a transparent insulating substrate using an indium oxide/tin oxide target under an atmosphere of a mixed gas containing argon and oxygen, if the ratio of oxygen to argon in the mixed gas is set such that the carrier density of the film becomes a maximum, then crystallization of the film is promoted until a stable state as a conductive film is reached and change in the surface resistance of the film upon the substrate being subjected to prescribed heat treatment is suppressed, and in particular that if the ratio of oxygen to argon in the mixed gas is in a range of 0.016 to 0.018, then the percentage change between the surface resistance of the film before the prescribed heat treatment and the surface resistance of the film after the prescribed heat treatment can be kept down to within ±10%.

To attain the above object, the present invention provides a method of manufacturing a substrate having a transparent conductive film, by carrying out sputtering on a transparent insulating substrate using an indium oxide/tin oxide target under an atmosphere comprising a mixed gas of argon and oxygen, wherein a ratio of oxygen to argon in the mixed gas is set such that the film has a maximum carrier density.

According to this method of manufacturing a substrate having a transparent conductive film, the ratio of oxygen to argon in the mixed gas is set such that the carrier density of the film becomes a maximum, and hence crystallization of the film is promoted until a stable state as a conductive film is reached and change in the surface resistance of the film upon the substrate being subjected to prescribed heat treatment is suppressed.

Preferably, the ratio of oxygen to argon in the mixed gas is in a range of 0.016 to 0.018.

If the ratio of oxygen to argon in the mixed gas is controlled to the range of 0.016 to 0.08, crystallization of the film is promoted until a stable state as a conductive film is reached and change in the surface resistance of the film upon the substrate being subjected to prescribed heat treatment is suppressed.

The method according to the present invention includes a step of carrying out heat treatment on the transparent insulating substrate after the sputtering, and wherein a percentage change between a surface resistance of the film before the heat treatment and a surface resistance of the film after the heat treatment is within a range of ±10%.

According to the method of the present invention, heat treatment is carried out after the sputtering, and the percentage change between the surface resistance of the film before the heat treatment and the surface resistance of the film after the heat treatment is not more than ±10%, and hence an appropriate potential gradient with respect to position can be obtained and a substrate suitable for a touch panel can be provided.

According to the method of the present invention, even if heat treatment is carried out under ordinary conditions, that is, for at least 30 minutes and at at least 160° C., a substrate suitable for a touch panel can be reliably provided.

Preferably, the method according to the present invention includes a step of removing impurities from a surface of the transparent insulating substrate before the sputtering is carried out.

Since impurities are removed from the surface of the transparent insulating substrate before sputtering, the formation of an impurity-containing ITO film on the surface of the substrate can be suppressed, and an ITO film having improved crystallinity can be obtained.

Also preferably, the film has a thickness of not more than 30 nm. As a result, the optical transparency of the substrate can be improved.

Preferably, the surface resistance of the film is in a range of 300 to 1000Ω. As a result, an appropriate potential gradient with respect to position can be obtained and a substrate suitable for a touch panel can be provided.

Preferably, the variation in the surface resistance distribution of the film is not more than ±10%. As a result, an appropriate potential gradient with respect to position can be reliably obtained and a substrate suitable for a touch panel can be provided.

Also preferably, the transparent insulating substrate has at least 90% of transmittance of light of wavelength 550 nm after the sputtering. As a result, a substrate suitable for a touch panel that must have high optical transparency can be reliably obtained.

If a glass substrate is used for the transparent insulating substrate, the above-mentioned effects can be realized reliably.

Further, if an $SiO_2$ film is formed on the glass substrate in advance, the above-mentioned effects can be realized more reliably.

To attain the above object, the present invention further provides a substrate having a transparent conductive film manufactured using a method wherein sputtering is carried out on a transparent insulating substrate using an indium oxide/tin oxide target under an atmosphere comprising a mixed gas of argon and oxygen, and wherein a ratio of oxygen to argon in the mixed gas is set such that the film has a maximum carrier density.

According to this substrate having a transparent conductive film, a substrate suitable for a touch panel can be obtained.

To attain the above object, the present invention also provides a touch panel using the above substrate having a transparent conductive film.

According to this touch panel, input positions can be detected accurately.

The above and other objects, features and advantages of the invention will become more apparent from the following detailed description taken in conjunction with the accompanying drawings.

BRIEF DESCRIPTION OF THE DRAWINGS

FIGS. 2A to 2C are explanatory views showing the crystalline state of an ITO film; specifically:

FIGS. 5A and 5B are schematic views showing crystal growth in an ITO film; specifically:

DETAILED DESCRIPTION OF PREFERRED EMBODIMENTS

The present invention has been attained based on the results of the studies described above.

According to the present invention, an ITO film is formed on the surface of a substrate by carrying out sputtering under an atmosphere of a mixed gas of argon and oxygen using an indium oxide/tin oxide target in which 10 mass % of tin oxide has been added to indium oxide.

The ratio of oxygen to argon in the mixed gas (hereinafter referred to as the 'oxygen proportion') is preferably in a range of 0.016 to 0.018, the thickness of the ITO film is preferably 30 nm, and the surface resistance of the ITO film is preferably in a range of 300 to 1000Ω. Furthermore, the substrate is preferably a glass substrate.

Moreover, it is preferable to remove impurities from the surface of the substrate by, for example, plasma processing before the sputtering is carried out.

Figure 1A:
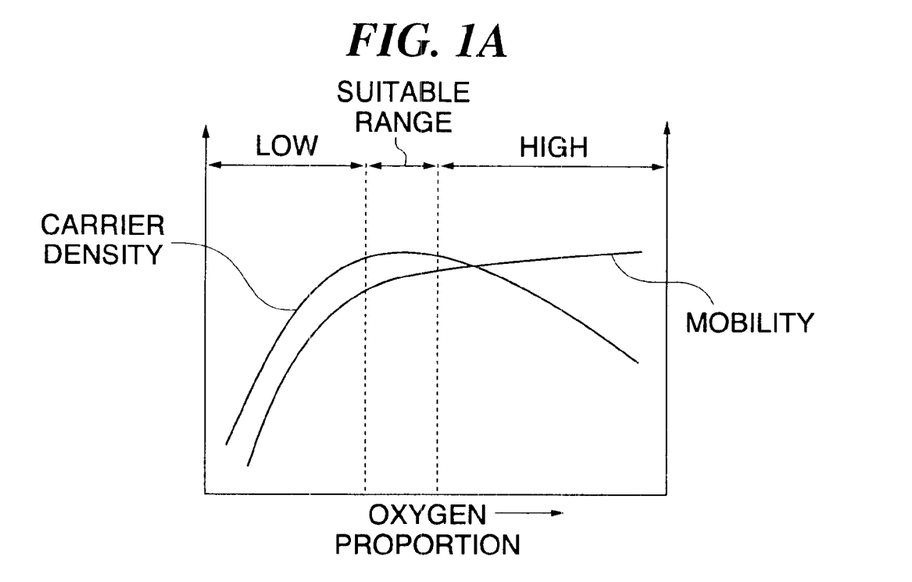
FIG. 1A is a graph showing carrier density and mobility against oxygen proportion, of an ITO film.

The carrier density and mobility of the ITO film formed on the glass substrate change with the ratio of oxygen to argon in the mixed gas during the sputtering as shown in FIG. 1A.

Here, the carrier density represents the number of electrons and/or positive holes that can contribute to electronic conduction in the material per unit volume (units: $cm^{-3}$). The mobility represents the ease of carriers (i.e. electrons and/or positive holes) from one site to the next in the material, that is the extent of spreading of orbits, or the extent of overlap between orbits or the size of the interaction between orbits (units: $cm^2/(V \cdot s)$).

In FIG. 1A, when the oxygen proportion is below 0.016, the lower limit of a suitable range, the carrier density and the mobility rise as the oxygen proportion rises. When the oxygen proportion is within the suitable range, 0.016 to 0.018, the carrier density reaches a maximum but the mobility continues to rise progressively. When the oxygen proportion is above 0.018, the upper limit of the suitable range, the carrier density falls as the oxygen proportion rises but the mobility still continues to rise progressively.

Figure 1B:
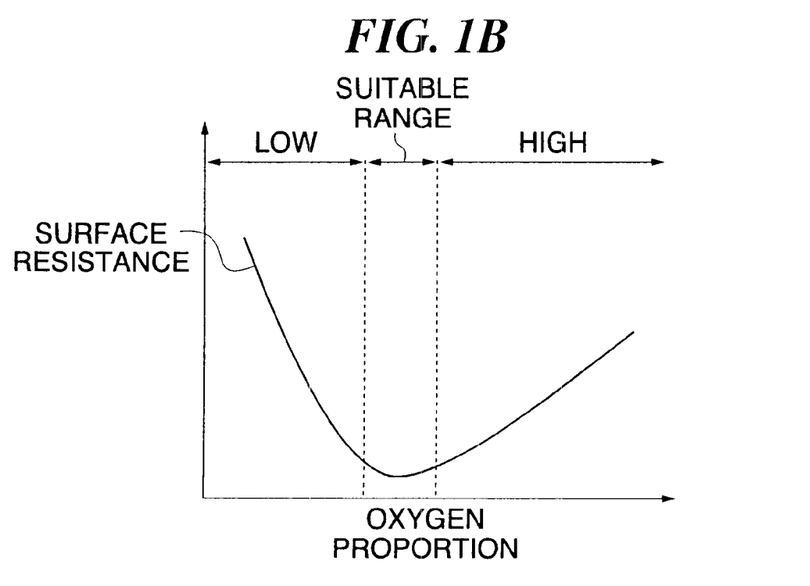
FIG. 1B is a graph showing surface resistance against oxygen proportion, of an ITO film.

The surface resistance of the ITO film is the reciprocal of the product of the carrier density and the mobility, that is 1/(carrier density×mobility). FIG. 1B shows a graph of the surface resistance, and it can be seen that the surface resistance takes a minimum value when the oxygen proportion is in the above-mentioned suitable range.

Figure 2A:
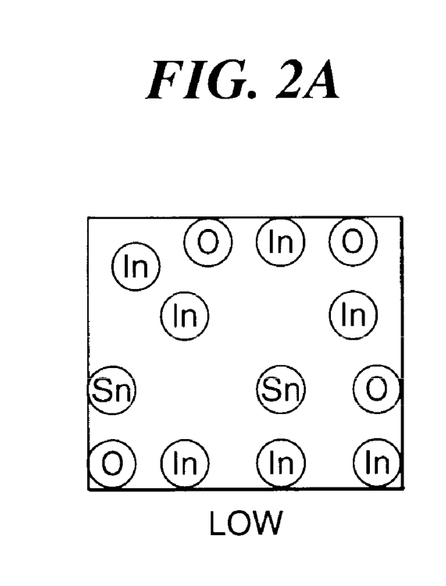
FIG. 2A shows the crystalline state of an ITO film when the oxygen proportion is below 0.016, the lower limit of a suitable range.

FIG. 2A is a view useful in explaining the crystalline state of the ITO film when the oxygen proportion is below 0.016, the lower limit of the suitable range.

In FIG. 2A, when the oxygen proportion is below 0.016, the lower limit of the suitable range, there is a lack of oxygen resulting in an ITO film with many oxygen defects and poor crystallinity, and hence the mobility is extremely low. Moreover, when there are oxygen defects in this way, electrons are not ejected and hence the carrier density is low. Furthermore, when the tin (Sn) in the tin oxide added to the target is taken into the ITO film during the sputtering, if the ITO film has poor crystallinity in this way, then the amount of Sn taken into the ITO film is low, resulting in a low carrier density. As a result of the above, when the oxygen proportion is below 0.016, the lower limit of the suitable range, the surface resistance of the ITO film is high.

When an analog detection type touch panel that uses such an ITO film is manufactured, heat treatment is carried out as a post-processing step. Oxidation and crystallization of the ITO film proceed during this heat treatment, with the number of oxygen defects falling and the amount of Sn taken into the ITO film increasing. As a result, the mobility and the carrier density both increase and the surface resistance of the ITO film drops considerably, with the crystalline state becoming as shown in FIG. 2B described below.

Figure 2B:
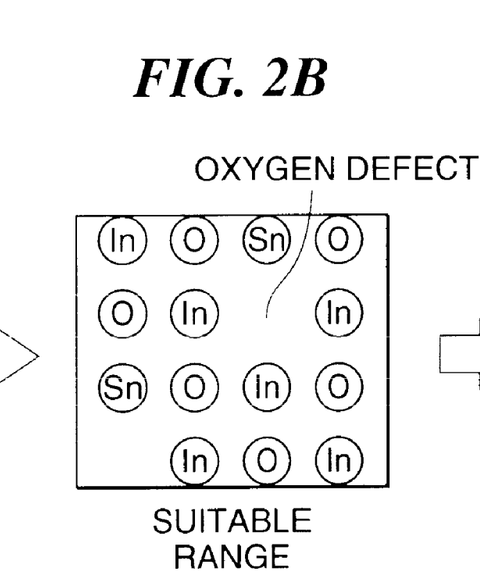
FIG. 2B shows the crystalline state of an ITO film when the oxygen proportion is within a suitable range of 0.016 to 0.018.

FIG. 2B is a view useful in explaining the crystalline state of the ITO film when the oxygen proportion is within the suitable range of 0.016 to 0.018.

In FIG. 2B, that is when the oxygen proportion is within the suitable range of 0.016 to 0.018, there are a few oxygen defects, but the crystallinity is good and hence the mobility is high. Moreover, the effects of Sn being taken into the ITO film and ejection of electrons due to oxygen defects are obtained to just the right extent and hence the carrier density is at a maximum. As a result of the above, when the oxygen proportion is within the suitable range of 0.016 to 0.018, the surface resistance of the ITO film is low.

Figure 2C:
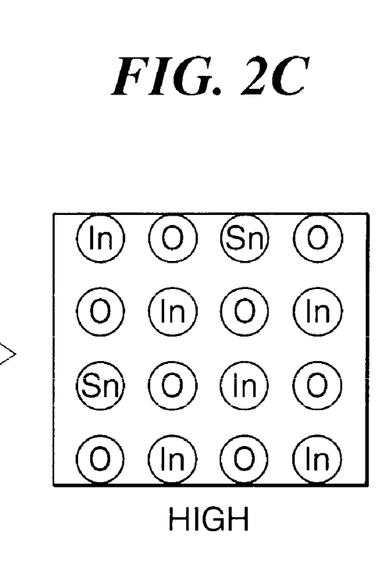
FIG. 2C shows the crystalline state of an ITO film when the oxygen proportion is above 0.018, the upper limit of a suitable range.

FIG. 2C is a view useful in explaining the crystalline state of the ITO film when the oxygen proportion is above 0.018, the upper limit of the suitable range.

In FIG. 2C, that is when the oxygen proportion is above 0.018, the upper limit of the suitable range, the ITO film has good crystallinity, with most of the oxygen defects having been filled in, and hence the mobility is high. However, when most of the oxygen defects are filled in in this way, the effect of ejection of electrons is no longer obtained, and hence the carrier density decreases progressively with increasing oxygen proportion. As a result of the above, when the oxygen proportion is above 0.018, the upper limit of the suitable range, the surface resistance of the ITO film increases progressively with increasing oxygen proportion.

As described above, oxidation and crystallization of the ITO film proceed upon heat treatment, and hence the number of oxygen defects decreases further and the mobility rises slightly. However, when the number of oxygen defects decreases in this way, the effect of ejection of electrons decreases and hence the carrier density drops. As a result, the surface resistance of the ITO film increases.

As described above, when the proportion of oxygen in the mixed gas is increased during ITO film formation and when heat treatment is carried out while manufacturing an analog detection type touch panel, oxidation and crystallization of the ITO film proceed and the number of oxygen defects decreases. As the crystallinity of the ITO film improves, the mobility, which is inversely proportional to the surface resistance, increases. However, the carrier density, which is also inversely proportional to the surface resistance, is small when the ITO film has a crystal structure containing many oxygen defects as shown in FIG. 2A due to ejection of electrons not occurring, but also becomes small when the ITO film has a crystal structure in which most of the oxygen defects are filled in as shown in FIG. 2C due to the effect of the ejection of electrons no longer being obtained. When the ITO film has a crystal structure containing a moderate number of oxygen defects as shown in FIG. 2B, even when oxidation of the ITO film proceeds upon heat treatment, the oxygen defects are not filled in to an extent that the effect of the ejection of electrons is no longer obtained, and hence the carrier density does not drop and change in the surface resistance is suppressed.

An ITO film of thickness not more than 30 nm used in a touch panel is liable to have a structure with poor crystallinity as shown in FIG. 2A, in which case there will be a large percentage change in the surface resistance of the ITO film upon heat treatment. However, according to the present invention, even when the ITO film has a thickness of not more than 30 nm, by suitably selecting the proportion of oxygen in the mixed gas during the deposition of the ITO film, an ITO film in which the percentage change in the surface resistance is low can be formed. It should be noted that in the case of an ITO film of thickness 50 nm or more used as a conductive film for an LCD, an ITO film of good crystallinity can be obtained even if the proportion of oxygen in the mixed gas during the deposition of the ITO film is not controlled so strictly.

EXAMPLE

The following experiments were carried out to confirm the above findings.

A soda lime glass substrate of size 300×400 mm and thickness 0.7 mm having an $SiO_2$ film of thickness about 70 nm formed on both surfaces by liquid phase deposition was used. This substrate was cleaned with a neutral detergent in a dipping type ultrasonic cleaner, and then dried using a warm current of air. The cleaned substrate was then suspended from a jig specially designed for the purpose in a cylindrical rotating body of diameter 1700 mm and height 1260 mm placed in a chamber of internal diameter 1900 mm and height 2150 mm, and an ITO film was deposited by DC magnetron sputtering. The target used was an indium oxide/tin oxide target, with the amount of tin oxide added relative to the indium oxide being 10 mass %; two such targets of size 127 mm×914 mm were installed in the door part of the chamber.

1000 $cm^3$ per minute (under standard conditions) (hereinafter referred to as 'SCCM') of Ar gas and 10 SCCM of $O_2$ gas were then introduced, and a plasma was generated between the substrate and a cathode, removing impurities from the surfaces of the substrate at an irradiation power per unit area of 0.9 W/$cm^2$. The temperature of the glass substrate in the chamber was made to be 200° C., and the chamber was evacuated to $1.3 \times 10^{-3}$ Pa using a turbo-molecular pump. 300 SCCM of Ar gas and a predetermined amount of $O_2$ gas were then introduced so that the pressure was made to be 0.27 Pa. The sputtering was carried out by pre-sputtering for 30 seconds with shutters over a front surface of the target and then opening the shutters. The power during the sputtering was 1.0 kW. The ratio of oxygen to argon in the mixed gas, the film thickness, and the heat treatment conditions were set as shown in Table 1, and the ratio of the surface resistance of the ITO film after the heat treatment to that before the heat treatment (i.e. surface resistance after heat treatment/surface resistance before heat treatment) was measured. Considering that heat treatment is carried out for about 30 minutes at a maximum of 160° C. during the printing step and the heat sealing step when manufacturing an analog detection type touch panel, it is considered that the heat treatment for 30 minutes at 200° C. used in the present experiments was quite adequate as a substitute for the heat treatment carried out in these printing and heat sealing steps. The surface resistance was measured using a four-point probe method, and the film thickness was measured using a stylus-type step measuring instrument. Moreover, the transmittance of the substrate after film deposition was measured using green light of wavelength 550 nm. The surface resistance was measured at 5 points on the surface of the substrate, with the larger of (|maximum value−mean value|/mean value) and (|minimum value−mean value|/mean value) being taken as the variation in the surface resistance distribution. The measurement results are shown in Table 1.

TABLE 1

| SAMPLE | OXYGEN PROPORTION | FILM THICKNESS (nm) | TRANSMITTANCE (%) | HEAT TREATMENT CONDITIONS | SURFACE RESISTANCE ($\Omega$) BEFORE HEAT TREATMENT | SURFACE RESISTANCE ($\Omega$) AFTER HEAT TREATMENT |
|---|---|---|---|---|---|---|
| EXAMPLES | | | | | | |
| 1 | 0.016 | 15 | 93.0 | 200° C., 30 min | 334 | 311 |
| 2 | 0.016 | 11 | 94.1 | " | 486 | 450 |
| 3 | 0.016 | 9 | 94.4 | " | 804 | 792 |
| 4 | 0.017 | 14 | 93.4 | " | 330 | 322 |
| 5 | 0.017 | 11 | 94.2 | " | 523 | 518 |
| 6 | 0.017 | 9 | 94.5 | " | 819 | 771 |

TABLE 1-continued

| | | | | | | |
|---|---|---|---|---|---|---|
| 7 | 0.018 | 15 | 93.3 | " | 337 | 358 |
| 8 | 0.018 | 11 | 94.3 | " | 512 | 545 |
| 9 | 0.018 | 8 | 94.6 | " | 831 | 878 |
| 10 | 0.018 | 8 | 94.6 | 200° C., 60 min | 826 | 891 |
| COMPARATIVE EXAMPLES | | | | | | |
| 1 | 0.013 | 15 | 92.3 | 200° C., 30 min | 333 | 255 |
| 2 | 0.015 | 15 | 92.8 | " | 328 | 284 |
| 3 | 0.019 | 14 | 93.7 | " | 339 | 394 |
| 4 | 0.020 | 15 | 93.7 | " | 347 | 429 |

| SAMPLE | RATIO OF SURFACE RESISTANCE AFTER HEAT TREATMENT TO BEFORE HEAT TREATMENT | VARIATIN IN SURFACE RESISTANCE DISTRIBUTION (%) | | OVERALL EVALUATION |
|---|---|---|---|---|
| | | BEFORE HEAT TREATMENT | AFTER HEAT TREATMENT | |
| EXAMPLES | | | | |
| 1 | 0.931 | 3.5 | 4.2 | ○ |
| 2 | 0.926 | 2.8 | 3.7 | ○ |
| 3 | 0.985 | 7.0 | 6.7 | ○ |
| 4 | 0.976 | 2.2 | 1.8 | ○ |
| 5 | 0.990 | 5.2 | 5.8 | ○ |
| 6 | 0.941 | 5.7 | 5.1 | ○ |
| 7 | 1.062 | 3.9 | 3.6 | ○ |
| 8 | 1.064 | 3.1 | 4.2 | ○ |
| 9 | 1.057 | 7.6 | 8.0 | ○ |
| 10 | 1.079 | 6.2 | 8.5 | ○ |
| COMPARATIVE EXAMPLES | | | | |
| 1 | 0.766 | 8.5 | 7.8 | X |
| 2 | 0.866 | 4.3 | 6.8 | X |
| 3 | 1.162 | 2.7 | 5.8 | X |
| 4 | 1.236 | 1.4 | 2.3 | X |

As shown Table 1, all of the samples showed good uniformity in the surface resistance distribution, with the variation in the surface resistance distribution fulfilling the requirement of being not more than ±10%. Moreover, with all of the samples, the transmittance was over 90%.

The following can be seen from Table 1.

With Examples 1, 4 and 7, in which the oxygen proportion was in a range of 0.016 to 0.018, the change in the surface resistance upon heat treatment was not more than ±10%.

With Examples 2, 3, 5, 6, 8 and 9, the oxygen proportion was again in a range of 0.016 to 0.018, but the ITO film was made thinner than with Examples 1, 4 and 7 to give a high-resistance ITO film of resistance approximately 500Ω or 800Ω, which is about the resistance value generally used with touch panels. All of these samples once again showed not more than ±10% as the change in the surface resistance of the ITO film upon heat treatment.

With Example 10, the oxygen proportion was made to be 0.018, and harsher conditions were supposed with the heat treatment being carried out at 200° C. for 60 minutes. Even with this sample, the change in the surface resistance of the ITO film upon heat treatment was not more than ±10%; it is thus thought that the change in the surface resistance would have also been not more than ±10% even if a lower oxygen proportion of 0.016 or 0.017 had been used when depositing the ITO film.

With Comparative Examples 1 and 2, the ITO film was deposited with an oxygen proportion of less than 0.016, and the change in the surface resistance of the ITO film upon heat treatment was more than ±10%.

With Comparative Examples 3 and 4, the ITO film was deposited with an oxygen proportion of above 0.018, and the change in the surface resistance of the ITO film upon heat treatment was again more than ±10%.

The above results show that in the case of an oxygen proportion in a range of 0.016 to 0.018 and a surface resistance in a range of 300 to 1000Ω, the change in the surface resistance upon heat treatment is not more than ±10%.

What is claimed is:

1. A method of manufacturing a substrate having a transparent conductive film, by carrying out magnetron sputtering on a transparent insulating substrate using an indium oxide/tin oxide target under an atmosphere comprising a mixed gas of argon and oxygen, wherein a ratio of oxygen to argon in said mixed gas is set in a range of 0.016 to 0.018 such that said film has a maximum carrier density.

2. A method as claimed in claim 1, including a step of carrying out heat treatment on said transparent insulating substrate after said sputtering, and wherein a percentage change between a surface resistance of said film before said heat treatment and a surface resistance of said film after said heat treatment is within a range of ±10%.

3. A method as claimed in claim 2, wherein said heat treatment is carried out for at least 30 minutes and a temperature of said heat treatment is at least 200° C.

4. A method as claimed in claim 1, including a step of removing impurities from a surface of said transparent insulating substrate before said sputtering is carried out.

5. A method as claimed in claim 1, wherein said film has a thickness of not more than 30 nm.

6. A method as claimed in claim 1, wherein said film has surface resistance in a range of 300 to 1000Ω.

7. A method as claimed in claim 3, wherein said film after said heat treatment has variation in a surface resistance distribution of not more than ±10%.

8. A method as claimed in claim 1, wherein said transparent insulating substrate has at least 90% of transmittance of light of wavelength 550 nm after said sputtering.

9. A method as claimed in claim 1, wherein said transparent insulating substrate is a glass substrate.

10. A method as claimed in claim 9, wherein an $SiO_2$ film is formed on said glass substrate in advance.

* * * * *